(12) United States Patent
Wu et al.

(10) Patent No.: US 11,630,175 B1
(45) Date of Patent: Apr. 18, 2023

(54) METHOD FOR MEASURING THE GRADIENT FIELD OF A NUCLEAR MAGNETIC RESONANCE (NMR) SYSTEM BASED ON THE DIFFUSION EFFECT

(71) Applicant: WUXI MARVEL STONE HEALTHCARE CO., LTD., Wuxi (CN)

(72) Inventors: Ziyue Wu, Wuxi (CN); Hai Luo, Wuxi (CN); Xiao Chen, Wuxi (CN)

(73) Assignee: WUXI MARVEL STONE HEALTHCARE CO., LTD., Wuxi (CN)

(*) Notice: Subject to any disclaimer, the term of this patent is extended or adjusted under 35 U.S.C. 154(b) by 0 days.

(21) Appl. No.: 17/912,055

(22) PCT Filed: Apr. 14, 2020

(86) PCT No.: PCT/CN2020/084740
§ 371 (c)(1),
(2) Date: Sep. 16, 2022

(87) PCT Pub. No.: WO2021/184470
PCT Pub. Date: Sep. 23, 2021

(30) Foreign Application Priority Data

Mar. 17, 2020 (CN) .......................... 202010187921.9

(51) Int. Cl.
*G01R 33/46* (2006.01)
(52) U.S. Cl.
CPC ................................ *G01R 33/4625* (2013.01)

(58) Field of Classification Search
CPC .................................................. G01R 33/4625
(Continued)

(56) References Cited

U.S. PATENT DOCUMENTS

| | | | |
|---|---|---|---|
| 2003/0214287 A1* | 11/2003 | Sun | ........................ G01V 3/32 324/303 |
| 2011/0105890 A1* | 5/2011 | Niendorf | ............ G01R 33/4833 600/413 |

(Continued)

FOREIGN PATENT DOCUMENTS

| | | | |
|---|---|---|---|
| CN | 105068024 A | 11/2015 | |
| CN | 105158712 A | 12/2015 | |

(Continued)

*Primary Examiner* — Christopher P McAndrew
(74) *Attorney, Agent, or Firm* — Bayramoglu Law Offices LLC (57) ABSTRACT

A method for measuring a gradient field of a nuclear magnetic resonance (NMR) system based on a diffusion effect uses a non-uniform field magnet, an NMR spectrometer, a radio frequency (RF) power amplifier, an RF coil, and a standard quantitative phantom with known apparent diffusion coefficient (ADC) and time constant for decay of transverse magnetization after RF-pulse (T2). A plurality of sets of signals are acquired by an NMR sequence with different diffusion-sensitive gradient durations or different echo spacings and the magnitude of the gradient field is calculated by fitting based on the plurality of sets of signals. The method does not require an additional dedicated magnetic field detection device, has a short measurement time, is easy to use with the NMR system, and is convenient to complete gradient field measurement at the installation site, thereby improving the installation and service efficiency of the NMR system.

10 Claims, 4 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2013/0057280 A1* | 3/2013 | Feiweier | G01R 33/4835 |
| | | | 324/309 |
| 2016/0291113 A1* | 10/2016 | Stemmer | G01R 33/56341 |
| 2020/0191894 A1* | 6/2020 | Carinci | G01R 33/4835 |

FOREIGN PATENT DOCUMENTS

| | | |
|---|---|---|
| CN | 107015181 A | 8/2017 |
| CN | 107957565 A | 4/2018 |
| JP | H06169 A | 1/1994 |
| WO | 2017132182 A1 | 8/2017 |

\* cited by examiner

METHOD FOR MEASURING THE GRADIENT FIELD OF A NUCLEAR MAGNETIC RESONANCE (NMR) SYSTEM BASED ON THE DIFFUSION EFFECT

CROSS REFERENCE TO THE RELATED APPLICATIONS

This application is the national phase entry of International Application No. PCT/CN2020/084740, filed on Apr. 14, 2020, which is based upon and claims priority to Chinese Patent Application No. 202010187921.9, filed on Mar. 17, 2020, the entire contents of which are incorporated herein by reference.

TECHNICAL FIELD

The present disclosure relates to the technical field of nuclear magnetic resonance (NMR), and in particular, to a method for measuring the gradient field of an NMR system based on the diffusion effect.

BACKGROUND

Nuclear magnetic resonance (NMR) technology utilizes the NMR phenomenon of hydrogen protons to image or detect the composition and structure of a material. Nuclei with an odd number of protons in the human body, such as hydrogen nuclei, have spins. The charged nuclei with spins are physically analogous to individual small magnets with random directional distributions in the absence of an external force. When the human body is placed in an external magnetic field, these small magnets rearrange according to the magnetic field lines of the external magnetic field. If the nuclei are excited by using radio frequency (RF) pulses of a specific frequency, the spins of the nuclei (small magnets) are deflected, and resonance occurs, which is the NMR phenomenon. If the RF pulses are stopped, the excited nuclei (small resonating magnets) gradually return to their pre-excitation state. During this process, electromagnetic signals are released. The NMR signals can be received and processed by special equipment to acquire the NMR image or the composition and structure information of the material.

The magnet is one of the core components in the NMR system. The magnet in the traditional NMR system requires a highly uniform magnetic field, so the design, production, maintenance and cost of the magnet have very high requirements. In recent years, a non-uniform field NMR system has appeared, which uses a magnet of low uniformity, such as a single-sided permanent magnet. The magnet of the non-uniform field NMR system is very small, easy to design and manufacture, and low-cost. The non-uniform field NMR system can be used for oil detection, food detection, geological exploration, and even medical detection, and has promising application prospects.

Figure 1:
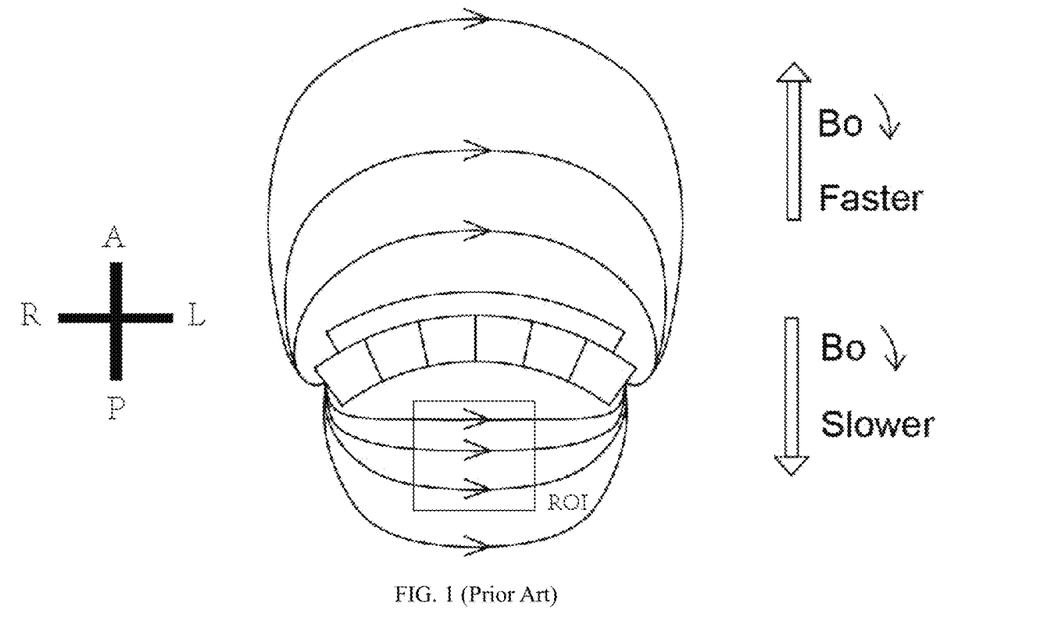
FIG. 1 shows a magnetic field distribution of a single-sided magnet used for nuclear magnetic resonance (NMR)

FIG. 1 shows the magnetic field distribution of a single-sided magnet used in an NMR system. As shown in FIG. 1, on the lower side of the magnet, the B0 field decays slowly, and a region close to the magnet forms an expected region of interest (ROI) with a relatively uniform magnetic field. In contrast, outside the ROI and on the upper side of the magnet, the B0 field decays fast.

Figure 2:
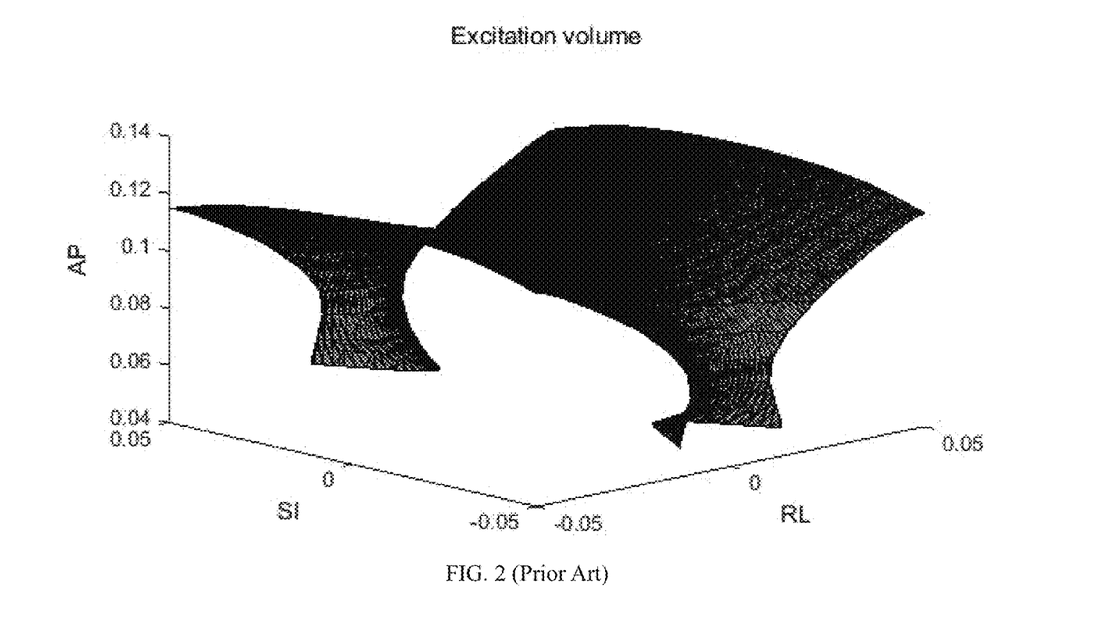
FIG. 2 shows an excitation region of a single-sided magnet NMR system.

In NMR applications, the exact value of the gradient field is a very important and necessary parameter, so it is necessary to measure the gradient field in advance. However, it is difficult to accurately measure the gradient field in the excitation region of the NMR system using a single-sided magnet. This is because the NMR system using a single-sided magnet has the following characteristics: 1. The gradient field is very large. 2. The gradient field is different at almost every location. 3. The actual excitation region has a complex irregular geometric shape, which is far from that of an ideal ROI. FIG. 2 shows the excitation region of an NMR system using a single-sided magnet.

In the prior art, the spatial distribution of the magnetic field is mainly measured by a magnetic field measuring device (such as a Gauss meter). Then the gradient field distribution is calculated, and an approximate equivalent value of the gradient field is calculated according to the measured values in the entire ROI. This measurement is time-consuming, requires more than a few hours, and is extremely inaccurate.

Molecules in matter all have a certain diffusion motion with a random direction, which is called thermal motion or Brownian motion of molecules. After the NMR signal is excited, the diffusion motion of water molecules in the direction of the gradient field will cause the attenuation of the NMR signal. If the water molecules diffuse more freely in the direction of the gradient field, they will have a greater diffusion distance during the application of the gradient field and experience a greater magnetic field change, resulting in more significant tissue signal attenuation. Therefore, the diffusion motion level of water molecules in an object can be measured by NMR technology, and the measured physical quantity is called the apparent diffusion coefficient (ADC). The ADC is an inherent property of matter, which reflects the diffusion motion level of matter at a specific temperature.

At the specific temperature, the strength of the NMR signal is related to the ADC, the strength of the diffusion gradient field, and the action time of the diffusion gradient field. Specifically, the logarithm of the NMR signal is directly proportional to the ADC, directly proportional to the square of the gradient field, and directly proportional to the square of the diffusion-sensitive gradient duration. As shown in Eq. (1), D denotes the ADC, G denotes the gradient field, and T denotes the diffusion-sensitive gradient duration.

$$\ln S \propto DG^2 T^2 \qquad (1)$$

Therefore, if the ADC of a material under test is known, the magnitude of the gradient field can be inversely derived from a set of signals acquired by an NMR sequence with different diffusion-sensitive gradient durations.

SUMMARY

The present disclosure aims to provide a method for measuring a gradient field of a nuclear magnetic resonance (NMR) system based on a diffusion effect. The present disclosure does not require an additional dedicated magnetic field detection device, has a short measurement time, is easy to use with the NMR system, and is convenient to complete gradient field measurement at the installation site. Therefore, the present disclosure can improve the installation and service efficiency of the NMR system.

To achieve the above objective, the present disclosure adopts the following technical solution:

The present disclosure provides a method for measuring a gradient field of an NMR system based on a diffusion effect, including the following steps:

S100: acquiring M sets of echo signals in a non-uniform field NMR system, where the echo signal is a four-dimensional array S(m, n, a, p);

where a first dimension denotes an echo spacing vector τ with a length of M;

a second dimension denotes an echo train length N;
a third dimension denotes an averaging number A; and
a fourth dimension denotes the number of sampling points of a single readout data, which is P;

S200: data preprocessing: converting the echo signal S(m, n, a, p) into a one-dimensional or two-dimensional array S':

S210: performing Fourier transform on the fourth dimension of the echo signal S to acquire frequency domain data and reserving a low-frequency part;

S220: averaging data;

S230: taking the logarithm of all data; and

S240: calculating a time series t(m);

S300: calculating a coefficient a by a fitting function:

$$S'=f(\alpha, T2, t(m))$$

where T2 is a known time constant for decay of transverse magnetization after radio frequency (RF)-pulse on a standard quantitative phantom; and S400: calculating a gradient field by a calculation function:

$$G = c * \sqrt{\frac{a}{\gamma^2 D}}$$

where γ denotes the gyromagnetic ratio, D denotes a known apparent diffusion coefficient (ADC) of the standard quantitative phantom, G denotes the measured gradient field, and c denotes a constant coefficient.

Preferably, in step S100, in the non-uniform field NMR system, an excitation pulse, refocusing pulses, and a constant gradient field may be applied.

The excitation pulse may have a flip angle of θ and may be followed by a plurality of refocusing pulses with a flip angle of 2θ.

The excitation pulse and a first refocusing pulse have a phase difference of 90° and a time interval of τ/2, and the time interval between the first refocusing pulse and the first acquisition window may be τ/2.

The time interval between the refocusing pulses may be defined as echo spacing. N echo signals may be acquired by one excitation and have an echo spacing τ. The echo signals may be acquired for multiple times and may be averaged.

The echo spacing τ may be changed to perform M measurements to acquire the M sets of echo signals.

Preferably, in step S200, the echo signal S(m, n, a, p) may be converted into S'(m, n).

Step S220 may be to average the third dimension.

In step S240, the time series t(m)=[τ(m)]^2, where τ(m) denotes an m-th element in the echo spacing vector τ.

Preferably, step S300 may include:

S310: estimating the equivalent coefficient α:
fitting S'(m, n):

$$S'(m, n) = -n\sqrt{t(m)}\left(\frac{1}{T2} + a*t(m)\right) + C_1 \quad (4)$$

where $C_1$ denotes a constant.

Preferably, in step S400, the constant coefficient of the calculation function for the gradient field may be expressed as follows:

$$c = 2\sqrt{3} \quad (6).$$

Preferably, in step S100, in the non-uniform field NMR system, an excitation pulse, refocusing pulses, and a constant gradient field may be applied.

The excitation pulse may include a first excitation pulse with a flip angle of θ.

The refocusing pulses include a first refocusing pulse, a second refocusing pulse, . . . , and an n-th refocusing pulse, each with a flip angle of 2θ.

The phase difference between the first excitation pulse and the first refocusing pulse may be 90°, and the phase difference between the first refocusing pulse and the subsequent refocusing pulses may be 0°.

The time interval between the first excitation pulse and the first refocusing pulse may be T, which may be defined as a diffusion-sensitive gradient duration.

The time interval between the first refocusing pulse and the first acquisition window may be T.

The time interval between the first acquisition window and the second refocusing pulse may be τ/2. The time interval between the subsequent refocusing pulses may be τ, and the time interval between the subsequent acquisition windows may be τ.

N echo signals may be acquired by one excitation, and the echo signals may be acquired for multiple times and may be averaged.

The diffusion-sensitive gradient duration T may be changed to perform M measurements to acquire the M sets of echo signals.

Preferably, in step S200, the echo signal S(m, n, a, p) may be converted into S'(m).

Step S220 may be to average the third dimension and the second dimension.

In step S240, the time series t(m)=[T(m)]^2, where T(m) denotes an m-th element in the diffusion-sensitive gradient duration series T.

Preferably, step S300 may be to calculate the equivalent coefficient α by a fitting function:

$$S'(m) = -at(m) - \frac{2\sqrt{t(m)}}{T2} + C_2 \quad (7)$$

where $C_2$ denotes an unknown constant.

Preferably, in step S400, the constant coefficient of the calculation function for the gradient field may be expressed as follows:

$$c = \sqrt{\frac{3}{2}}. \quad (8)$$

Preferably, the non-uniform field NMR system may include a console, an NMR spectrometer, a magnet, an RF system, and the standard quantitative phantom.

The console may be connected to the NMR spectrometer and may be configured to send a command to control parameter selection and region of interest (ROI) positioning of a measurement sequence, receive an NMR signal acquired by the NMR spectrometer, and complete real-time data processing.

The magnet may be designed as a permanent magnet.

The RF system may include an RF power amplifier, a preamplifier, a transceiver switch, and an RF coil. The RF coil may transmit an excitation signal and receive the NMR signal through the transceiver switch.

The standard quantitative phantom may be a glass container filled with a solution with known standard ADC and T2.

The present disclosure has the following beneficial effects:

1. The NMR system of the present disclosure includes the NMR device and the standard quantitative phantom. It adopts a diffusion-weighted sequence to acquire signals and can measure the equivalent gradient field magnitude of the excitation region without the need for special magnetic field measurement tools, which is convenient and fast.

2. The method of the present disclosure has a short measurement time.

3. The method of the present disclosure is easy to use with the NMR system, and it is very convenient to complete the gradient field measurement at the installation site, thereby improving the installation and service efficiency of the NMR system.

DETAILED DESCRIPTION OF THE EMBODIMENTS

To make the objectives, technical solutions, and advantages of the present disclosure clearer, the following describes the present disclosure in more detail with reference to the accompanying drawings.

In the present disclosure, some terms used are as follows:
NMR: Nuclear Magnetic Resonance
MRI: Magnetic Resonance Imaging
K-space: a frequency domain space of an NMR signal
DWI: Diffusion-Weighted Imaging
T1: Time constant for regrowth of longitudinal magnetization after RF-pulse
T2: Time constant for decay of transverse magnetization after RF-pulse
TR: Repetition Time
ADC: Apparent diffusion coefficient
EPI: Echo planar imaging
CPMG: an NMR pulse sequence named by several scientists (Carr, Purcell, Meiboom, Gill)
SE-EPI: Spin echo-echo planar imaging As shown in FIG. 3, a system for measuring a gradient field of an NMR system based on a diffusion effect mainly includes a console, an NMR spectrometer, a magnet, an RF system, and a standard quantitative phantom.

Figure 3:
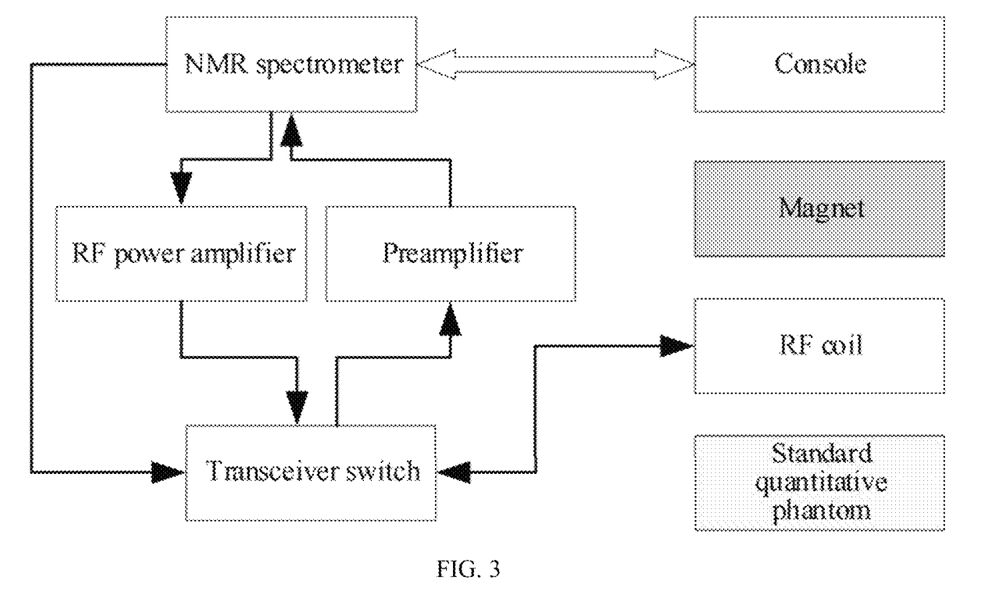
FIG. 3 is a schematic diagram of a system for measuring a gradient field of an NMR system based on a diffusion effect.

A block diagram of the system is shown in FIG. 3.

The console is connected to the NMR spectrometer and is configured to send a command to control the parameter selection and region of interest (ROI) positioning of a measurement sequence, receive an NMR signal acquired by the NMR spectrometer and complete real-time data processing. The magnet is generally a permanent magnet, such as a single-sided permanent magnet with a highly non-uniform magnetic field within the ROI.

The RF system mainly includes an RF power amplifier, a preamplifier, a transceiver switch, and an RF coil. The RF coil transmits an excitation signal and receives the NMR signal through the transceiver switch.

The standard quantitative phantom is a container made of non-metallic material or a non-conductor and filled with a specific solution with known standard ADC and T2. For example, it could be a glass container filled with pure water or a glass container filled with a 2% copper sulfate solution.

Embodiment 1

FIG. 3 shows the ADC measurement sequence of a non-uniform field NMR system. The sequence is composed of a series of precisely controlled RF pulses, which include a first excitation pulse, a first refocusing pulse, a second refocusing pulse, . . . , and an n-th refocusing pulse. The constant gradient field is a natural gradient field of the magnet and does not require control.

The flip angle of the first excitation pulse is θ, and the flip angle of all the subsequent refocusing pulses is 2θ. The phase difference between the first excitation pulse and the first refocusing pulse is 90°, and the phase difference between the first refocusing pulse and the subsequent refocusing pulses is 0°. The time interval between the first excitation pulse and the first refocusing pulse is T, which is defined as a diffusion-sensitive gradient duration. The time interval between the first refocusing pulse and the first acquisition window is T. The time interval between the first acquisition window and the second refocusing pulse is τ/2. The time interval between the subsequent refocusing pulses is τ, and the time interval between the subsequent acquisition windows is τ. N echo signals are acquired by one excitation. Often, a plurality of excitations and acquisitions are also required to improve the signal-to-noise ratio (SNR) by averaging the signals. To calculate the magnitude of the gradient field, it is necessary to change the diffusion-sensitive gradient duration T for a plurality of measurements to acquire the M sets of echo signals.

Gradient Field Estimating Algorithm

The acquired signal is a 4-dimensional array S(m, n, a, p). The first dimension corresponds to different diffusion-sensitive gradient durations (i.e., T), that is, corresponding to an echo spacing vector τ having M sets of data in total. The second dimension denotes an echo train length N. The third dimension denotes an averaging number A. The fourth dimension denotes the number of sampling points of a single readout data, which is P The estimation of the gradient field based on the four-dimensional array mainly includes the following three steps:

1. Data preprocessing

Preprocessing step 1: Perform Fourier transform on the fourth dimension of the echo signal S to acquire frequency domain data, reserve only a low-frequency part, and average.

Preprocessing step 2: Average the third dimension.

Preprocessing step 3: Average the second dimension.

Preprocessing step 4: Take the logarithm of all data. Through the preprocessing, the echo signal S(m, n, a, p) is converted into a one-dimensional array S'(m).

Preprocessing Step 5: Calculate a time series t(m)=[T(m)]^2.

2. Calculate the equivalent coefficient α by fitting:

$$S'(m) = -at(m) - \frac{2\sqrt{t(m)}}{T2} + C_2 \tag{1}$$

where T2 denotes a known time constant for decay of transverse magnetization after radio frequency (RF)-pulse on a standard quantitative phantom, S'(m) denotes the one-dimensional data after preprocessing, and $C_2$ denotes an unknown constant.

3. Calculate the gradient field $$G = \sqrt{\frac{3}{2}} * \sqrt{\frac{a}{\gamma^2 D}} \quad (2)$$

where γ denotes the gyromagnetic ratio, D denotes a known ADC of the standard quantitative phantom, and G denotes the measured gradient field magnitude.

Embodiment 2

Figure 4:
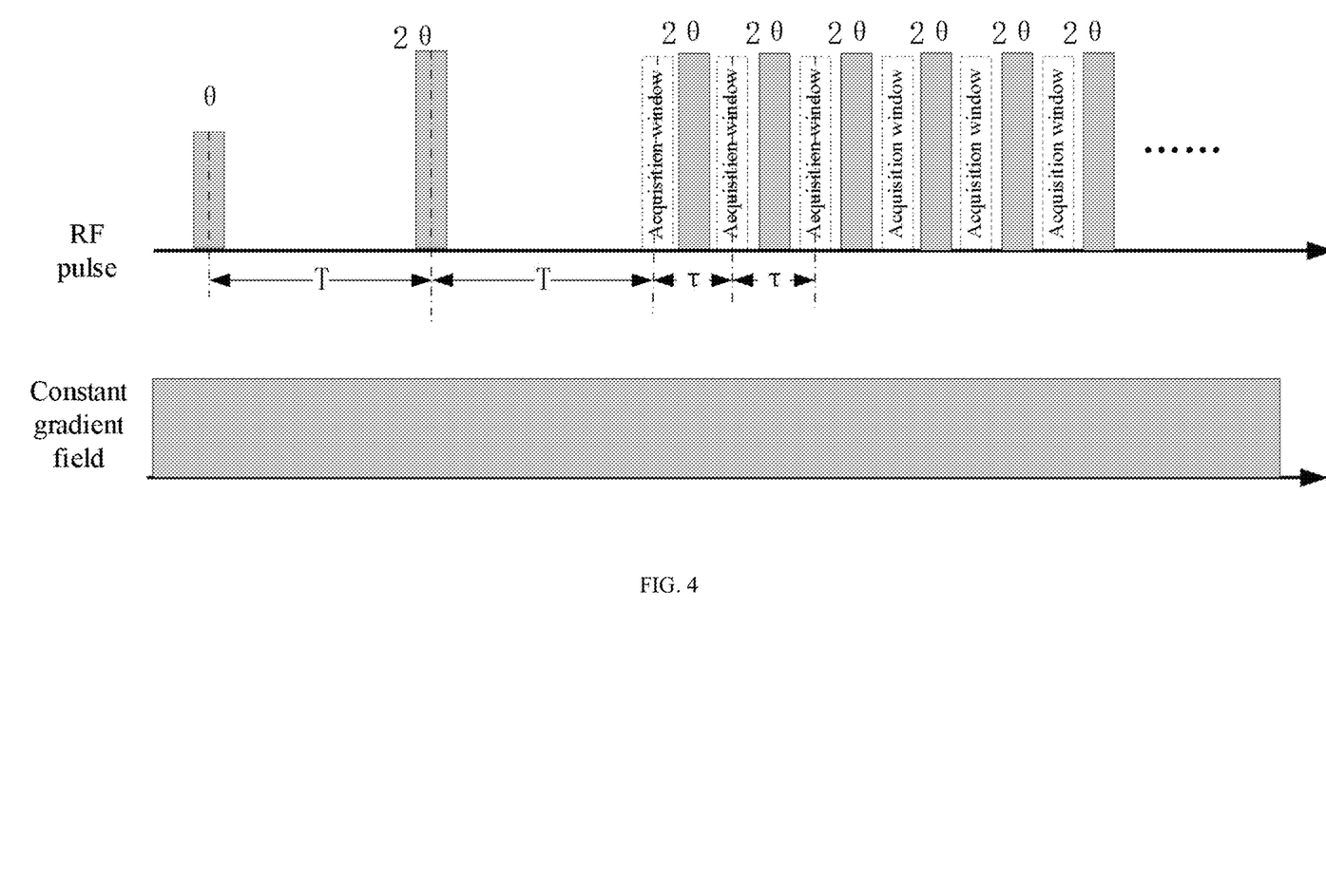
FIG. 4 shows a gradient field measurement sequence, namely a SE-CPMG sequence according to Embodiment 1.
Figure 5:
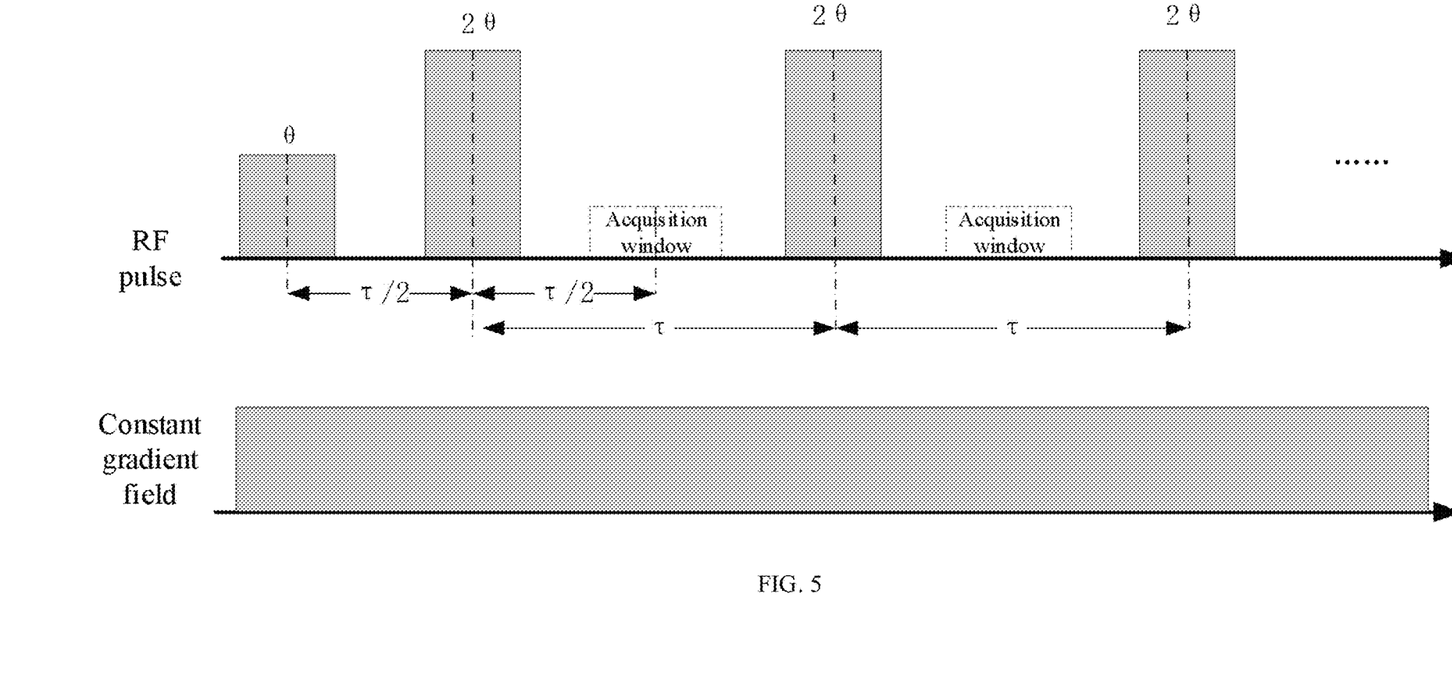
FIG. 5 shows a gradient field measurement sequence, namely a CPMG sequence according to Embodiment 2.

FIG. 4 shows an ADC measurement sequence of a non-uniform field NMR system, which uses a typical θ-2θ-2θ-2θ... RF pulse sequence. A first excitation pulse has a flip angle of θ and is followed by a plurality of refocusing pulses with a flip angle of 2θ. The phase difference between the first excitation pulse and the first refocusing pulse is 90°. The time interval between the first excitation pulse and the first refocusing pulse is τ/2. The time interval between the first refocusing pulse and the first acquisition window is τ/2. The time interval between the refocusing pulses is τ, which is defined as echo spacing. The constant gradient field is a natural gradient field of the magnet and does not require control. N echo signals are acquired by one excitation. Often, a plurality of excitations and acquisitions are also required to improve the signal-to-noise ratio (SNR) by averaging the signals. To calculate the magnitude of the gradient field, it is necessary to change the echo spacing τ for a plurality of measurements to acquire the M sets of echo signals.

Gradient Field Estimating Algorithm

The acquired signal is a 4-dimensional array S(m, n, a, p). The first dimension corresponds to different echo spacings, that is, corresponding to an echo spacing vector τ having M sets of data in total. The second dimension denotes an echo train length N. The third dimension denotes an averaging number A. The fourth dimension denotes the number of sampling points of a single readout data, which is P. The estimation of the gradient field based on the four-dimensional array mainly includes the following three steps:

1. Data preprocessing

Preprocessing step 1: Perform Fourier transform on the fourth dimension of the echo signal S to acquire frequency domain data, reserve only a low-frequency part, and average.

Preprocessing step 2: Average the third dimension.

Preprocessing step 3: Take the logarithm of all data. Through the preprocessing, the echo signal S(m, n, a, p) is converted into a two-dimensional array S'(m, n).

Preprocessing Step 4: Calculate a time series t(m)=[τ(m)]^2.

2. Estimate the equivalent coefficient α

Calculate the equivalent coefficient α by fitting S'(m, n):

$$S'(m, n) = -\frac{n\sqrt{t(m)}}{at(m) + T2} + C_1 \quad (3)$$

where τ(m) denotes an m-th element in the echo spacing vector τ, T2 denotes a known time constant for decay of transverse magnetization after radio frequency (RF)-pulse on a standard quantitative phantom, and $C_I$ denotes an unknown constant.

3. Estimate the gradient field:

$$G = 2\sqrt{3} * \sqrt{\frac{a}{\gamma^2 D}} \quad (4)$$

where γ denotes the gyromagnetic ratio, D denotes a known ADC of the standard quantitative phantom, and G denotes the measured gradient field magnitude.

Certainly, the present disclosure may further include other various embodiments. A person skilled in the art can make various corresponding modifications and variations according to the present disclosure without departing from the spirit and essence of the present disclosure, but all these corresponding modifications and variations shall fall within the protection scope defined by the appended claims in the present disclosure.

What is claimed is:

1. A method for measuring a gradient field of a nuclear magnetic resonance (NMR) system based on a diffusion effect comprising the following steps:
   S100: acquiring M sets of echo signals in a non-uniform field NMR system, wherein the echo signal is a four-dimensional array S(m, n, a, p);
   wherein a first dimension denotes an echo spacing vector τ with a length of M;
   a second dimension denotes an echo train length N;
   a third dimension denotes an averaging number A; and
   a fourth dimension denotes a number of sampling points of a single readout data, wherein the number is P;
   S200: data preprocessing: converting the echo signal S(m, n, a, p) into a one-dimensional or two-dimensional array S':
      S210: performing Fourier transform on the fourth dimension of the echo signal S to acquire frequency domain data and reserving a low-frequency part;
      S220: averaging data;
      S230: taking logarithm of all data; and
      S240: calculating a time series t(m);
   S300: calculating an equivalent coefficient a by a fitting function:

S'=f(α,T2,t(m))

wherein T2 is a known time constant for decay of transverse magnetization after radio frequency (RF)-pulse on a standard quantitative phantom; and
   S400: calculating a gradient field by a calculation function:

$$G = c * \sqrt{\frac{a}{\gamma^2 D}}$$

wherein γ denotes the gyromagnetic ratio, D denotes a known apparent diffusion coefficient (ADC) of the standard quantitative phantom, c denotes a constant coefficient, and G denotes the gradient field.

2. The method according to claim 1, wherein in step S100, in the non-uniform field NMR system, an excitation pulse, refocusing pulses, and a constant gradient field are applied;

the excitation pulse has a flip angle of θ and is followed by a plurality of refocusing pulses with a flip angle of 2θ;

the excitation pulse and a first refocusing pulse have a phase difference of 90° and a time interval of τ/2, and a time interval between the first refocusing pulse and a first acquisition window is τ/2;

the time interval between the refocusing pulses is defined as the echo spacing; N echo signals are acquired by one excitation and have an echo spacing τ; and echo signals are acquired for multiple times and are averaged; and the echo spacing τ is changed to perform M measurements to acquire the M sets of echo signals.

3. The method according to claim 2, wherein in step S200, the echo signal S(m, n, a, q) is converted into S'(m, n);

step S220 is to average the third dimension; and in step S240, the time series t(m)=[τ(m)]^2, wherein τ(m) denotes an m-th element in the echo spacing vector τ.

4. The method according to claim 3, wherein step S300 comprises:

S310: estimating the equivalent coefficient α:

estimating the equivalent coefficient α by fitting S'(m, n):

$$S'(m, n) = -n\sqrt{t(m)}\left(\frac{1}{T2} + a*t(m)\right) + C_1$$

wherein $C_1$ denotes an unknown constant.

5. The method according to claim 4, wherein in step S400, the constant coefficient of the calculation function for the gradient field is expressed as follows:

$$c = 2\sqrt{3}.$$

6. The method according to claim 1, wherein in step S100, in the non-uniform field NMR system, an excitation pulse, refocusing pulses, and a constant gradient field are applied;

the excitation pulse comprises a first excitation pulse with a flip angle of θ;

the refocusing pulses comprise a first refocusing pulse, a second refocusing pulse, . . . , and an n-th refocusing pulse, each with a flip angle of 2θ;

a phase difference between the first excitation pulse and the first refocusing pulse is 90°, and a phase difference between the first refocusing pulse and subsequent refocusing pulses is 0°;

a time interval between the first excitation pulse and the first refocusing pulse is T, wherein T is defined as a diffusion-sensitive gradient duration;

a time interval between the first refocusing pulse and a first acquisition window is T;

a time interval between the first acquisition window and the second refocusing pulse is τ/2;

a time interval between subsequent refocusing pulses is τ, and a time interval between subsequent acquisition windows is τ;

N echo signals are acquired by one excitation; and echo signals are acquired for multiple times and are averaged; and the diffusion-sensitive gradient duration T is changed to perform M measurements to acquire the M sets of echo signals.

7. The method according to claim 6, wherein in step S200, the echo signal S(m, n, a, q) is converted into S'(m);

step S220 is to average the third dimension and the second dimension; and in step S240, the time series t(m)=[T(m)]^2, wherein T(m) denotes an m-th element in the diffusion-sensitive gradient duration series T.

8. The method according to claim 7, wherein step S300 is to calculate the equivalent coefficient α by a fitting function:

$$S'(m) = -at(m) - \frac{2\sqrt{t(m)}}{T2} + C_2$$

wherein $C_2$ denotes an unknown constant.

9. The method according to claim 8, wherein in step S400, the constant coefficient of the calculation function for the gradient field is expressed as follows:

$$c = \sqrt{\frac{3}{2}}.$$

10. The method according to claim 1, wherein the non-uniform field NMR system comprises a console, an NMR spectrometer, a magnet, an RF system, and the standard quantitative phantom, wherein the console is connected to the NMR spectrometer, and the console is configured to send a command to control parameter selection and region of interest (ROI) positioning of a measurement sequence, receive an NMR signal acquired by the NMR spectrometer, and complete real-time data processing;

the magnet is designed as a permanent magnet;

the RF system mainly comprises an RF power amplifier, a preamplifier, a transceiver switch, and an RF coil, wherein the RF coil transmits an excitation signal and receives the NMR signal through the transceiver switch; and the standard quantitative phantom is a glass container filled with a solution with known standard ADC and T2.

* * * * *